(12) United States Patent
Ueno (10) Patent No.: US 10,165,241 B2
(45) Date of Patent: Dec. 25, 2018

(54) SHIFT CONTROL CIRCUIT AND WIRELESS DEVICE

(71) Applicant: ICOM INCORPORATED, Osaka (JP)

(72) Inventor: Yasuo Ueno, Osaka (JP)

(73) Assignee: ICOM INCORPORATED, Osaka (JP)

( * ) Notice: Subject to any disclaimer, the term of this patent is extended or adjusted under 35 U.S.C. 154(b) by 0 days.

(21) Appl. No.: 15/692,742

(22) Filed: Aug. 31, 2017

(65) Prior Publication Data

US 2018/0091789 A1 Mar. 29, 2018

(30) Foreign Application Priority Data

Sep. 27, 2016 (JP) ................................. 2016-188514

(51) Int. Cl.
| | |
|---|---|
| H04N 9/66 | (2006.01) |
| H03C 3/06 | (2006.01) |
| H03C 3/09 | (2006.01) |
| H03D 3/18 | (2006.01) |
| H03G 3/30 | (2006.01) |
| H04L 27/16 | (2006.01) |
| H04L 27/22 | (2006.01) |
| G06F 1/10 | (2006.01) |
| H03G 11/00 | (2006.01) |
| H03K 5/131 | (2014.01) |

(52) U.S. Cl.
CPC ................ H04N 9/66 (2013.01); H03C 3/06 (2013.01); H03C 3/09 (2013.01); H03D 3/18 (2013.01); H03G 3/3063 (2013.01); H04L 27/16 (2013.01); H04L 27/22 (2013.01); G06F 1/10 (2013.01); H03G 11/00 (2013.01); H03K 5/131 (2013.01)

(58) Field of Classification Search
CPC ......... H03K 5/131; H03K 2005/00286; H04N 9/66; H04L 27/22; H04L 27/16; H03D 3/18
USPC ................................. 327/231, 232, 233, 237
See application file for complete search history.

(56) References Cited

FOREIGN PATENT DOCUMENTS

JP 61-265930 A 11/1986

*Primary Examiner* — John W Poos
(74) *Attorney, Agent, or Firm* — Ohlandt, Greeley, Ruggiero & Perle, L.L.P.

(57) ABSTRACT

A shift control circuit includes a first limiter circuit, a phase shifter, a first suppressor, and a reducer. The first limiter circuit limits the amplitude of a control target signal input from a microphone, having undergone A-D conversion by an A-D convener, and frequency differentiation by a pre-emphasis circuit, and having the relative intensity of harmonic components increased. The phase shifter performs, for the control target signal having undergone the amplitude limitation, phase shift on the frequency component within a first frequency range. The first suppressor suppresses, for the control target signal having undergone the phase shift, the frequency component equal to or greater than a second threshold. The reducer suppresses, for the control target signal having the suppressed frequency component, the frequency component within a second frequency range, and outputs as an information signal. A modulator performs frequency modulation on a carrier wave in accordance with the information signal, and a transmitter produces a transmission signal from the carrier wave having undergone the frequency modulation, and transmits the transmission signal via an antenna.

20 Claims, 10 Drawing Sheets

SHIFT CONTROL CIRCUIT AND WIRELESS DEVICE

CROSS-REFERENCE TO RELATED APPLICATION

This application claims the benefit of Japanese Patent Application No. 2016-188514, filed on Sep. 27, 2016, the entire disclosure of which is incorporated by reference herein.

FIELD

This application relates generally to a shift control circuit and a wireless device including the same.

BACKGROUND

In frequency modulation (FM) wireless devices, in order to set the maximum modulation degree (maximum frequency shift) in frequency modulation to be equal to or less than a prescribed value, an instantaneous deviation control (IDC) circuit is provided. A carrier wave is frequency-modulated in accordance with an output of the IDC circuit. This IDC circuit includes a limiter circuit and a splatter filter. In the limiter circuit, the amplitude of the input signal to the IDC circuit is restricted, and harmonic components produced at the limiter circuit are suppressed by the splatter filter.

In the wireless transceiver device disclosed in Unexamined Japanese Patent Application Kokai Publication No. S61-265930, sound signals from a microphone are frequency differentiated by a pre-amplifier and a pre-emphasis circuit, and a high-level signal is clipped by a limiter amplifier. In addition, the splatter filter suppresses harmonic components produced by clipping. The limiter amplifier and the splatter filter constitute the IDC circuit.

SUMMARY

A shift control circuit according to a first aspect of the present disclosure is provided in a wireless device that performs frequency modulation, and outputs an information signal to be applied to the frequency modulation. This shift control circuit includes:

a first limiter circuit that limits an amplitude of an input control target signal to be equal to or less than a first threshold;

a phase shifter that shifts, for the control target signal having the amplitude limited by the first limiter circuit to be equal to or less than the first threshold, a phase of a frequency component within a predetermined first frequency range by a predetermined amount;

a first suppressor that suppresses, for the control target signal phase-shifted by the phase shifter, the frequency component equal to or greater than a second threshold; and a reducer that suppresses, for any (i) the control target signal having the amplitude limited by the first limiter circuit to be equal to or less than the first threshold, (ii) the control target signal phase-shifted by the phase shifter, and (iii) the control target signal having the frequency component equal to or greater than the second threshold and suppressed by the first suppressor, a frequency component within a predetermined second frequency range, and thus reducing a wave height value of the information signal, in which the shift control circuit outputs the information signal that is the control target signal having the frequency component equal to or greater than the second threshold and suppressed by the first suppressor or the control target signal having the frequency component within the second frequency range and suppressed by the reducer.

Preferably, the reducer includes:

a second limiter circuit that limits, for the control target signal having the frequency component equal to or greater than the second threshold and suppressed by the first suppressor, the amplitude to be equal to or less than a third threshold; and a second suppressor that suppresses, for the control target signal having the amplitude limited by the second limiter circuit to be equal to or less than the third threshold, the frequency component equal to or greater than a fourth threshold, and the shift control circuit outputs the information signal that is the control target signal having the frequency component equal to or greater than the fourth threshold and suppressed by the second suppressor.

Preferably, the third threshold is greater than the first threshold.

Preferably, the fourth threshold is regarded as being consistent with the second threshold.

Preferably, the second frequency range is a frequency range equal to or less than a fifth threshold;

the reducer suppresses, for the control target signal having the amplitude limited by the first limiter circuit to be equal to or less than the first threshold, a frequency component equal to or less than the fifth threshold;

the phase shifter performs phase shift on the control target signal having the amplitude limited by the first limiter circuit to be equal to or less than the first threshold, and having the frequency component equal to or less than the fifth threshold and suppressed by the reducer; and the shift control circuit outputs the information signal that is the control target signal having the frequency component equal to or greater than the second threshold and suppressed by the first suppressor.

Preferably, the second frequency range is a frequency range equal to or less than a sixth threshold;

the reducer suppresses, for the control target signal phase-shifted by the phase shifter, the frequency component equal to or less than the sixth threshold;

the first suppressor suppresses, for the control target signal phase-shifted by the phase shifter and having the frequency component equal to or less than the sixth threshold and suppressed by the reducer, the frequency component equal to or greater than the second threshold; and the shift control circuit outputs the information signal that is the control target signal having the frequency component equal to or greater than the second threshold and suppressed by the first suppressor.

A wireless device according to a second aspect of the present disclosure includes:

any one of the above shift control circuits;

a modulator that performs frequency modulation of changing a frequency of a carrier wave in accordance with a signal level of the information signal; and a transmitter that produces a transmission signal from the carrier wave frequency-modulated by the modulator, and transmits the produced signal via an antenna.

Preferably, the above wireless device further includes an adjuster that adjusts, in accordance with an occupied bandwidth of the transmission signal, at least one of followings: the first frequency range that is a target for the phase shift by the phase shifter and the predetermined amount of the phase shift; the second threshold used by the first suppressor; and the second frequency range used by the reducer.

According to the present disclosure, by suppressing, for the control target signal, the frequency component within a predetermined frequency range, an increase in the maximum frequency shift in frequency modulation can be suppressed.

BRIEF DESCRIPTION OF THE DRAWINGS

A more complete understanding of this application can be obtained when the following detailed description is considered in conjunction with the following drawings, in which.

DETAILED DESCRIPTION

When, for example, a microphone is blown by breath, the microphone is tapped by a metal bar, a sound signal line is touched, and the microphone is utilized with a loud voice, the maximum frequency shift in frequency modulation may exceed the prescribed value. In this case, since the input signal to an instantaneous deviation control (IDC) circuit contains multiple frequency components, the multiple frequency components laid over on one another increase the wave height value of a signal applied to the frequency modulation. When the wave height value of the signal applied to the frequency modulation increases, the maximum frequency shift exceeds the prescribed value.

The present disclosure has been made in view of the foregoing circumstances, and an objective is to suppress an increase in the maximum frequency shift in frequency modulation.

Embodiments of the present disclosure are described in detail with reference to the figures below. The same or equivalent component is denoted by the same reference numeral.

Embodiment 1

Figure 1:
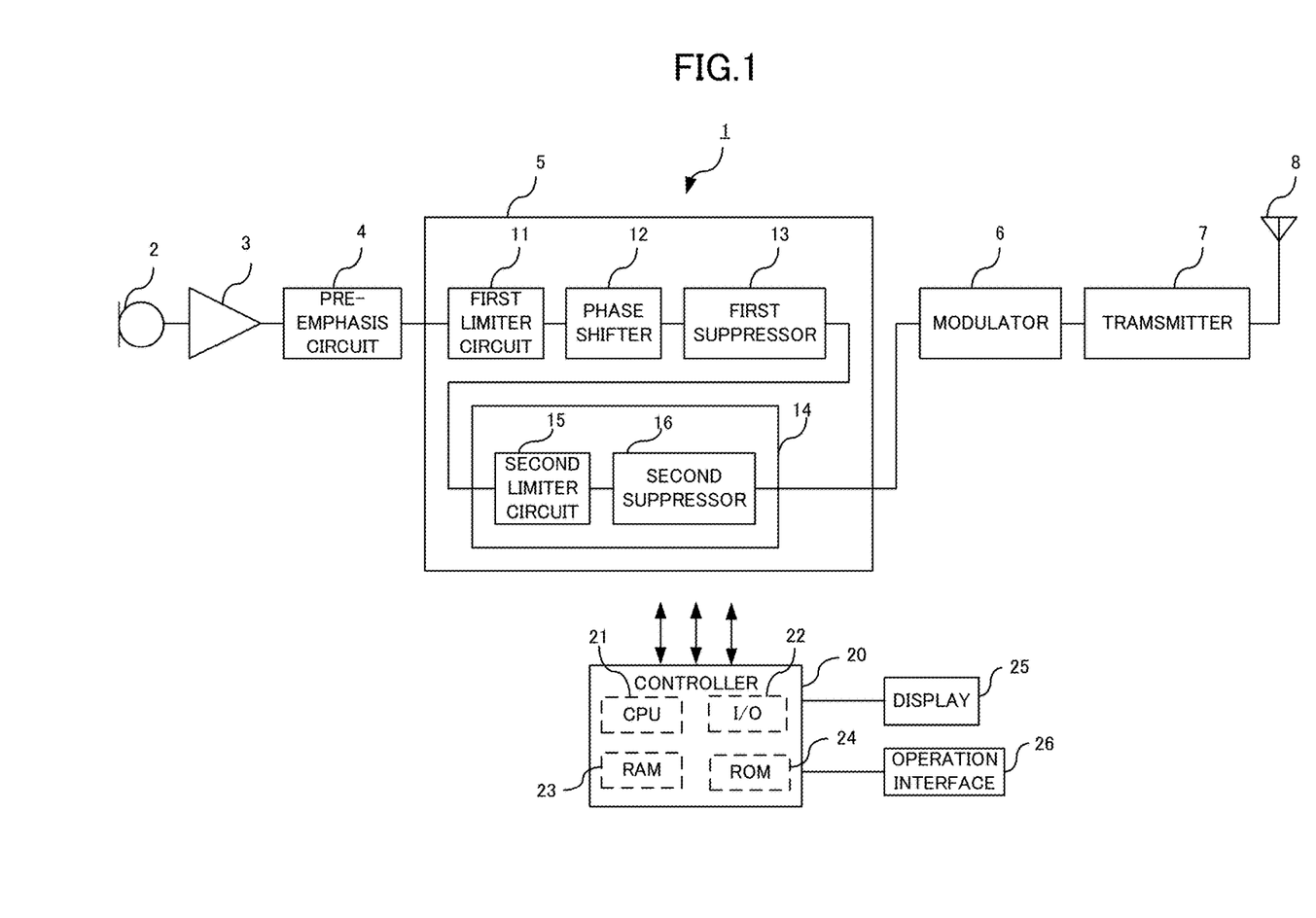
FIG. 1 is a block diagram illustrating an example configuration of a wireless device according to Embodiment 1 of the present disclosure.

FIG. 1 is a block diagram illustrating an example configuration of a wireless device according to Embodiment 1 of the present disclosure. A wireless device 1 includes a microphone 2, an analog-to-digital (A-D) converter 3 that performs analog-to-digital conversion on the input from the microphone 2, a pre-emphasis circuit 4 that performs frequency differentiation, and a shift control circuit 5. This wireless device 1 further includes a modulator 6 that performs frequency modulation in accordance with an information signal output by the shift control circuit 5, a transmitter 7 that produces a transmission signal in accordance with the output of the modulator 6, and transmits the produced transmission signal via an antenna 8, a controller 20, a display 25, and an operation interface 26. The shift control circuit 5 is an IDC circuit, and includes a first limiter circuit 11 that performs amplitude limitation, a phase shifter 12 that performs phase shift, a first suppressor 13 that suppresses harmonic components, and a reducer 14 that reduces the wave height value of the information signal by suppressing the frequency component within a predetermined frequency range. The controller 20 includes a central processing unit (CPU) 21, a random access memory (RAM) 23, and a read-only memory (ROM) 24. The subsequent stages to the A-D converter 3 may be accomplished by a digital signal processor (DSP).

In order to avoid the complexity of description and to facilitate understanding, in FIG. 1, signal lines from the controller 20 to each component of the wireless device 1 are omitted. The controller 20 is connected to each component of the wireless device 1 via an input/output (I/O) interface 22, and controls the start, end, and details of the process by each component. The CPU 21 executes a control program stored in the ROM 24, and controls the wireless device 1. In addition, the CPU 21 processes a command or data input from the operation interface 26 via the I/O interface 22, temporarily stores the processed command or data in the RAM 23, and the CPU 21 makes the display 25 display the stored command or data. The display 25 includes, for example, a liquid crystal display (LCD). In the example illustrated in FIG. 1, only the transmitter function of the wireless device 1 is illustrated, but the wireless device 1 may also have a receiver function.

A description is given of operation of each component in the wireless device 1. When a signal transmission is instructed from the operation interface 26, the microphone 2 outputs analog sound signals to the A-D converter 3 in accordance with input sounds. The A-D converter 3 converts the analog sound signals from the microphone 2 into digital signals, and outputs the digital signals to the pre-emphasis circuit 4. The pre-emphasis circuit 4 outputs a signal in a level proportional to the frequency of the input signal, that is, performs frequency differentiation, and pre-emphasizes the relative intensity of the harmonic components in the signal frequency differentiated in order to improve the signal-to-noise (S/N) ratio at the receiver side.

The shift control circuit 5 adjusts, for a control target signal input from the pre-emphasis circuit 4, the maximum frequency shift in frequency modulation performed by the modulator 6, which is described further below, so as to be equal to or less than a prescribed value, and outputs the information signal that is the adjusted control target signal to the modulator 6. A description is given of operation of each component in the shift control circuit 5. The first limiter circuit 11 performs amplitude limitation that limits the amplitude of the control target signal to be equal to or less than a first threshold. The first threshold can be defined in accordance with the prescribed value of the maximum frequency shift in frequency modulation by the modulator 6. By performing the amplitude limitation, the waveform of the control target signal that has a larger wave height value than the first threshold is changed from the sinusoidal waveform to a waveform that can be substantially regarded as a rectangular waveform. The rectangular wave includes a fundamental wave, and a harmonic wave that has a frequency which is odd multiple of the frequency of the fundamental wave. That is, in the first limiter circuit 11, a harmonic wave that has a frequency which is odd multiple of the frequency of the fundamental wave is produced. The sampling frequency of the first limiter circuit 11 is defined in accordance with the noise level produced by a folding and the process load for amplitude limitation.

The phase shifter 12 shifts a phase of the frequency component contained in the control target signal having undergone the amplitude limitation by the first limiter circuit 11 and within a predetermined first frequency range by a predetermined amount. The phase shifter 12 is an all-pass filter that includes, for example, an infinite impulse response (IIR) filter. The first frequency range can be defined in accordance with a possible value of the frequency of the control target signal.

The first suppressor 13 suppresses the frequency component equal to or greater than a second threshold and contained in the control target signal having undergone the phase shift by the phase shifter 12. The first suppressor 13 suppresses the harmonic components that are produced by the amplitude limitation by the first limiter circuit 11 and the phase shift by the phase shifter 12, and that are contained in the control target signal. The second threshold can be defined in accordance with the possible value of the frequency of the control target signal. The first suppressor 13 is a splatter filter that includes, for example, a finite impulse response (FIR) filter. The splatter filter attenuates the frequency component equal to or greater than the second threshold that is a cut-off frequency. When the splatter filter is accomplished by digital circuits, the attenuation characteristics of the splatter filter are sharp in comparison with those of analog circuits, and thus the harmonic components contained in the output of the first limiter circuit 11 are severely suppressed in comparison with a case of analog circuits. When the harmonic components are severely suppressed, the wave height value of the signal to be applied to frequency modulation varies per frequency, and thus the maximum frequency shift in frequency modulation varies per frequency. Hence, in the wireless device 1 according to Embodiment 1, the phase shifter 12 shifts a phase of harmonic components by the predetermined amount. In order to suppress the variability in the maximum frequency shift in frequency modulation, the phase shifter 12 shifts a phase of, for example, the third harmonic by the predetermined amount. The phase shift amount can be determined by simulations or tests. The phase shift by the phase shifter 12 suppresses the variability in the wave height value, and also suppresses the variability in the maximum frequency shift in frequency modulation.

When the control target signal contains multiple frequency components, and when a low-frequency component is produced by mixing the multiple frequency components by the first limiter circuit 11, the low-frequency component is phase-shifted by the phase shifter 12 and the wave height value of the signal to be output by the phase shifter 12 may increase. Since the wave height value can be regarded as the maximum frequency shift in frequency modulation, when the multiple frequency components are mixed by the first limiter circuit 11, and when the phase shifter 12 shifts the phase, the maximum frequency shift in frequency modulation also increases. In order to suppress an increase in the maximum frequency shift in frequency modulation, the shift control circuit 5 includes the reducer 14 that reduces the wave height value of the information signal by suppressing, for any of followings: the control target signal having undergone amplitude limitation by the first limiter circuit 11; the control target signal having undergone the phase shift by the phase shifter 12; and the control target signal having the frequency component equal to or greater than the second threshold and that is suppressed by the first suppressor 13, the frequency components within a predetermined second frequency range. The second frequency range is a frequency range that covers the low frequency component produced by mixing the multiple frequency components by the first limiter circuit 11, and can be defined in accordance with the possible value of the frequency of the control target signal.

In Embodiment 1, the reducer 14 suppresses the frequency component within the predetermined second frequency range for the control target signal that has the frequency component which is equal to or greater than the second threshold, and which is suppressed by the first suppressor 13. The reducer 14 includes a second limiter circuit 15, and a second suppressor 16. The second limiter circuit 15 performs amplitude limitation that limits the amplitude of the control target signal to be equal to or less than a third threshold. The third threshold can be defined in accordance with the prescribed value of the maximum frequency shift in frequency modulation performed by the modulator 6 is described further below. In Embodiment 1, the third threshold is greater than the first threshold. The second suppressor 16 suppresses, for the control target signal having the frequency component that is equal to or greater than the second threshold and is suppressed by the first suppressor 13, and having the amplitude limited by the second limiter circuit 15, the frequency component equal to or greater than a fourth threshold. That is, the second suppressor 16 suppresses the harmonic components contained in the control target signal and produced by the amplitude limitation by the second limiter circuit 15. The second suppressor 16 is a splatter filter that includes an FIR filter. The splatter filter attenuates the frequency equal to or greater than the fourth threshold that is the cut-off frequency. The fourth threshold can be defined in accordance with, like the second threshold, the prescribed value of the maximum frequency shift in frequency modulation by the modulator 6 is described further below. In Embodiment 1, the fourth threshold can be regarded as being consistent with the second threshold. The information signal, that is the control target signal that has the frequency component which is equal to or greater than the fourth threshold and is suppressed by the second suppressor 16, is input to the modulator 6.

Figure 2:
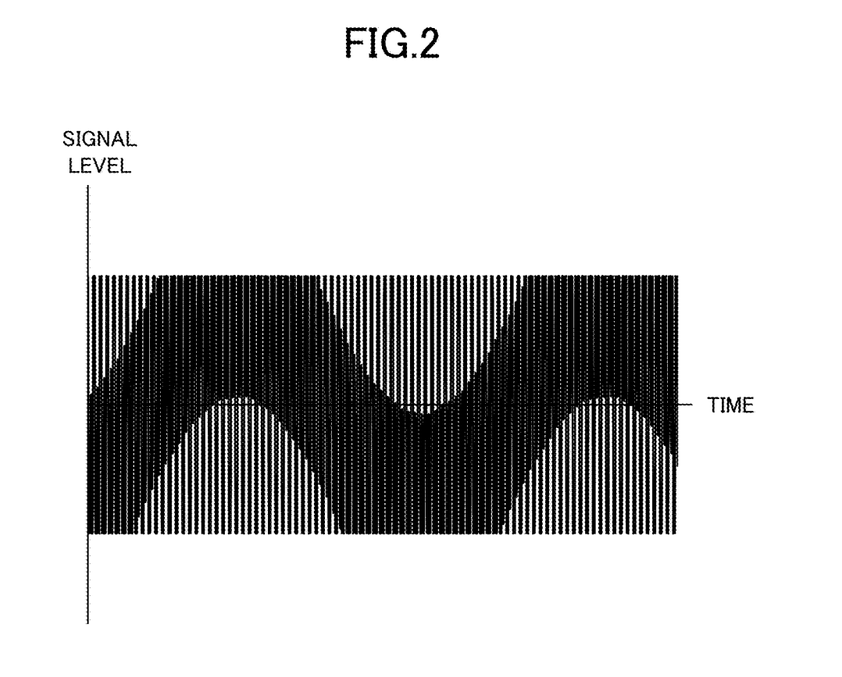
FIG. 2 is a diagram illustrating an example control target signal according to Embodiment 1.
Figure 3:
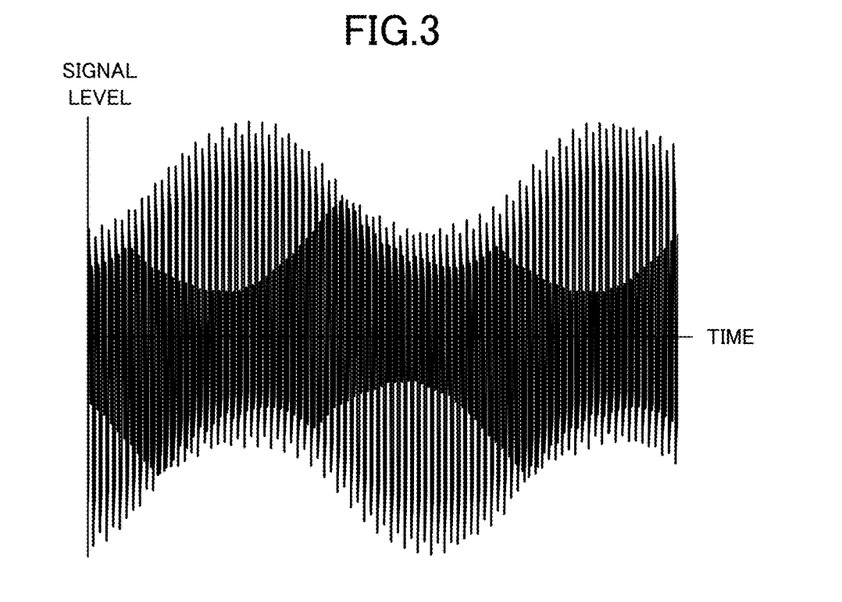
FIG. 3 is a diagram illustrating an example control target signal according to Embodiment 1.
Figure 4:
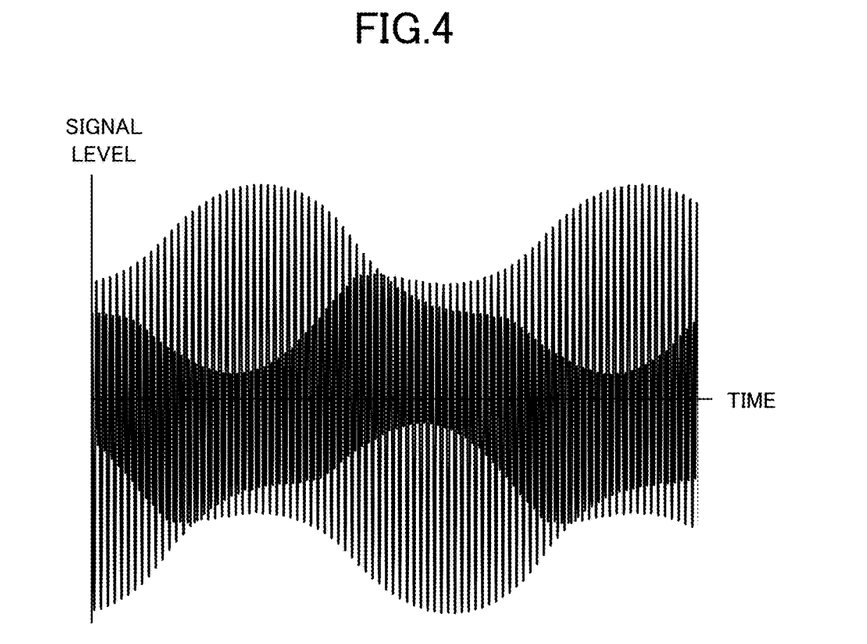
FIG. 4 is a diagram illustrating an example control target signal according to Embodiment 1.
Figure 5:
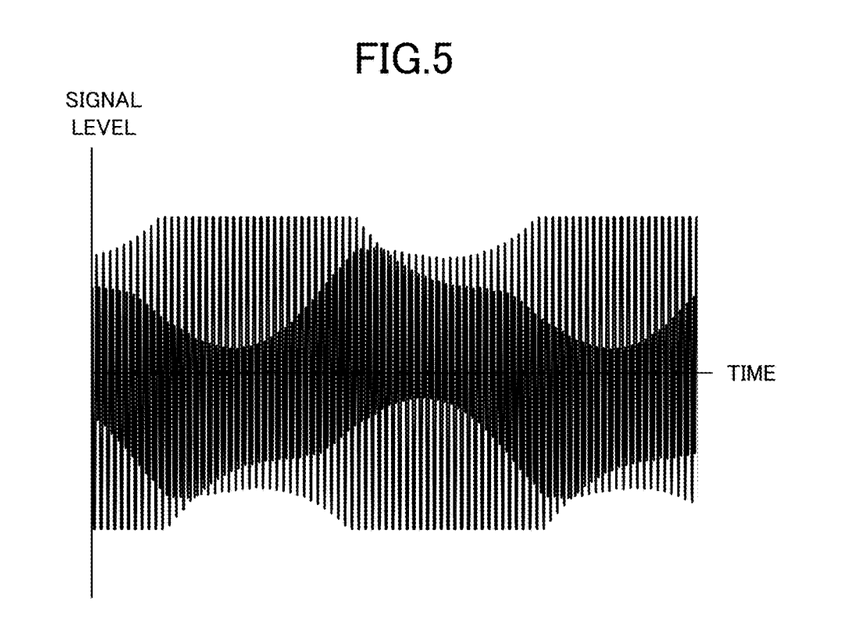
FIG. 5 is a diagram illustrating an example control target signal according to Embodiment 1.
Figure 6:
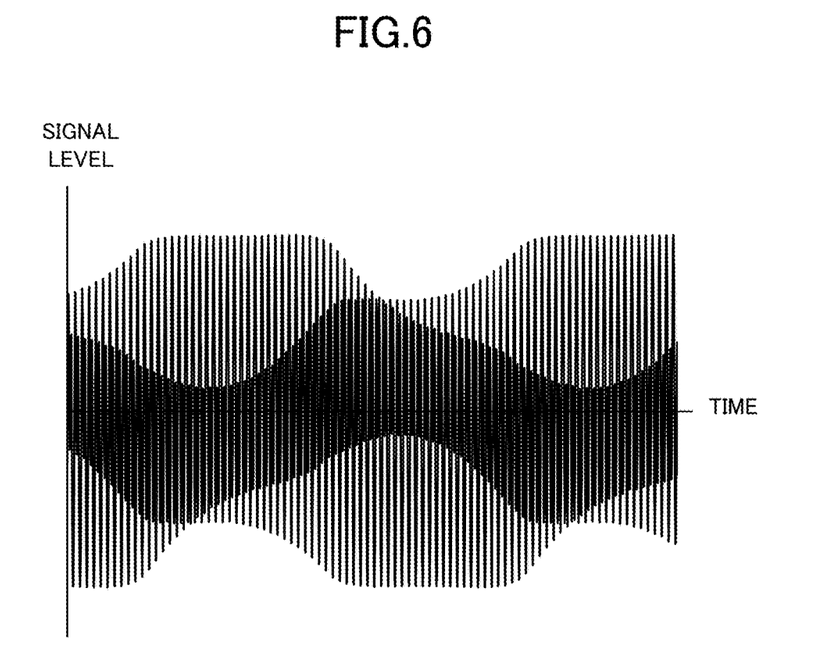
FIG. 6 is a diagram illustrating an example control target signal according to Embodiment 1.

FIGS. 2 to 6 are each a diagram illustrating an example control target signal according to Embodiment 1. FIGS. 2 to 6 each illustrate the signal waveform to be output by each component of the shift control circuit 5 when the control target signal that contains the frequency components of 1.1 kHz and 2.2 kHz is input to the shift control circuit 5. In FIGS. 2 to 6, the horizontal axis represents a time, while the vertical axis represents a signal level. FIG. 2 illustrates the signal waveform to be output by the first limiter circuit 11. FIG. 3 illustrates the signal waveform to be output by the phase shifter 12. By performing phase shift on the frequency component within the first frequency range, the wave height value increases. FIG. 4 illustrates the signal waveform to be output by the first suppressor 13. The signal to be output by the first suppressor 13 has the wave height value substantially consistent with the wave height value of the signal to be output by the phase shifter 12. FIG. 5 illustrates the signal waveform to be output by the second limiter circuit 15. FIG. 6 illustrates the signal waveform to be output by the second suppressor 16. The wave height value of the signal that is to be output by the second suppressor 16 and is the result obtained by performing the second amplitude limitation on the control target signal and suppressing the harmonic components produced by the amplitude limitation decreases in comparison with the wave height value of the signal to be output by the first suppressor 13. That is, by providing the reducer 14, the wave height value of the information signal is reduced.

By applying the phase shifter 12 that is an all-pass filter and by adjusting the Q value or center frequency of the all-pass filter, the adjustment of the maximum frequency shift characteristics is simplified. Since the all-pass filter can be accomplished by an IIR filter as described above, in comparison with an FIR filter, the process load can be reduced. Since the all-pass filter has no gain, that is, does not change the amplitude, nothing affects to the modulation sensitivity, and the maximum frequency shift characteristics can be adjusted.

The modulator 6 performs frequency modulation of changing the frequency of the carrier wave in accordance with the signal level of the information signal to be output by the second suppressor 16. The transmitter 7 produces a transmission signal from the carrier wave having undergone the frequency modulation by the modulator 6, and outputs the produced signal via the antenna 8.

Figure 7:
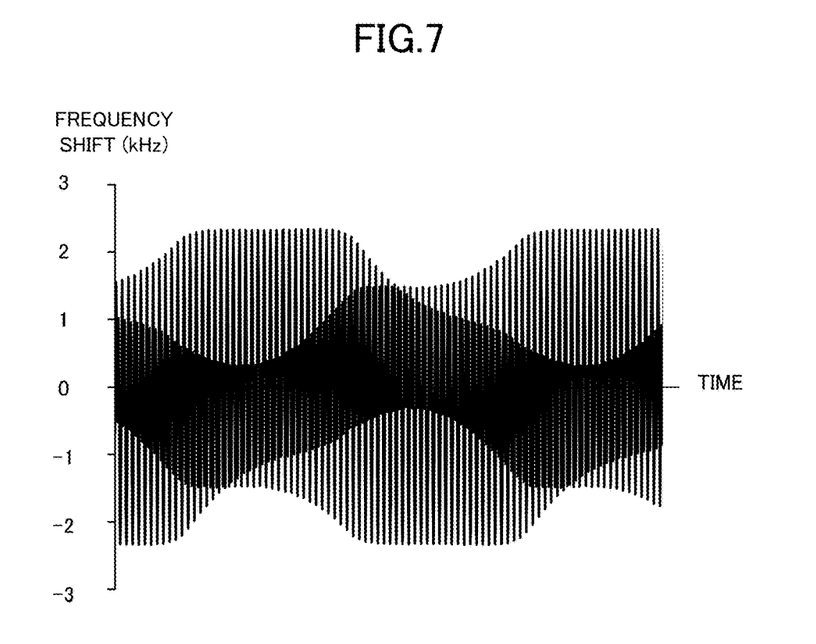
FIG. 7 is a diagram illustrating an example frequency shift in frequency modulation by the wireless device according to Embodiment 1.
Figure 8:
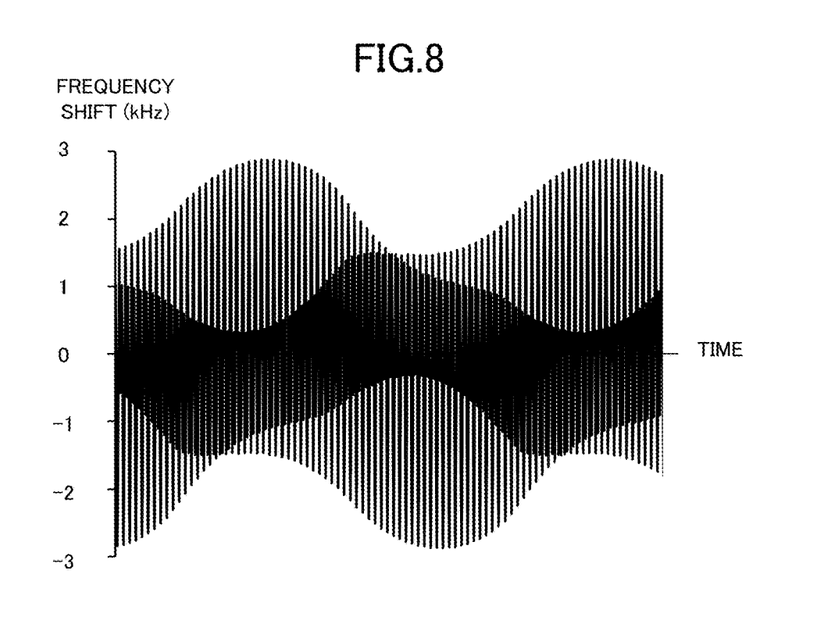
FIG. 8 is a diagram illustrating an example frequency shift in frequency modulation.

FIG. 7 is a diagram illustrating an example frequency shift in frequency modulation by the wireless device according to Embodiment 1. FIG. 7 illustrates the frequency shift in frequency modulation by the modulator 6 when the control target signal that contains frequency components of 1.1 kHz and 2.2 kHz is input to the shift control circuit 5. In FIG. 7, the horizontal axis represents a time, while the vertical axis represents a frequency shift (unit: kHz). FIG. 8 is a diagram illustrating an example frequency shift in frequency modulation. FIG. 8 is a diagram illustrating an example frequency shift in frequency modulation when the control target signal that contains frequency components of 1.1 kHz and 2.2 kHz is input to the shift control circuit 5, and the frequency modulation of changing the frequency of carrier wave is performed in accordance with the signal level of the signal to be output by the first suppressor 13. What the horizontal axis and the vertical axis in FIG. 8 represent are similar to those in FIG. 7. FIGS. 7 and 8 clarify that, by providing the reducer 14 that includes the second limiter circuit 15 and the second suppressor 16, an increase in the maximum frequency shift in frequency modulation can be suppressed.

Figure 9:
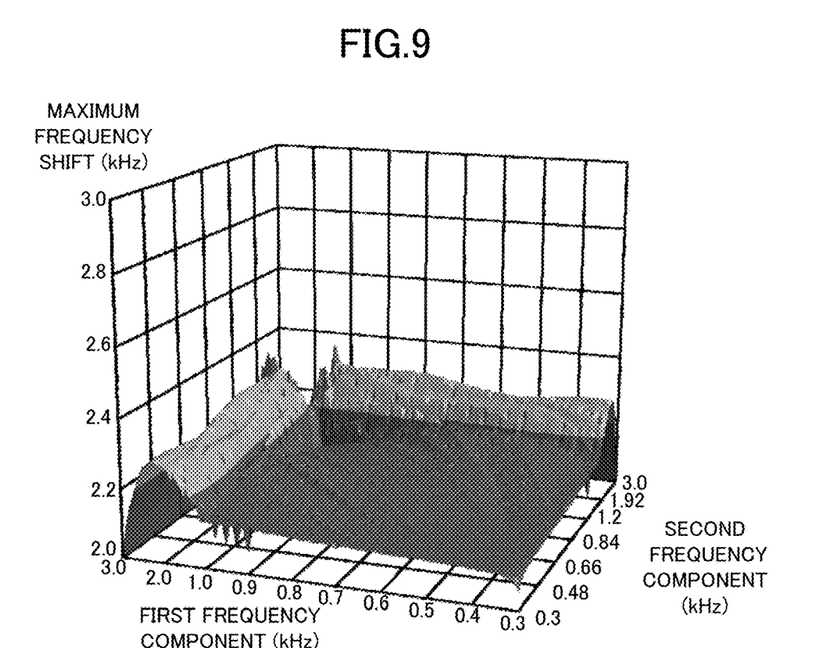
FIG. 9 is a diagram illustrating an example maximum frequency shift in frequency modulation by the vas fireless device according to Embodiment 1.
Figure 10:
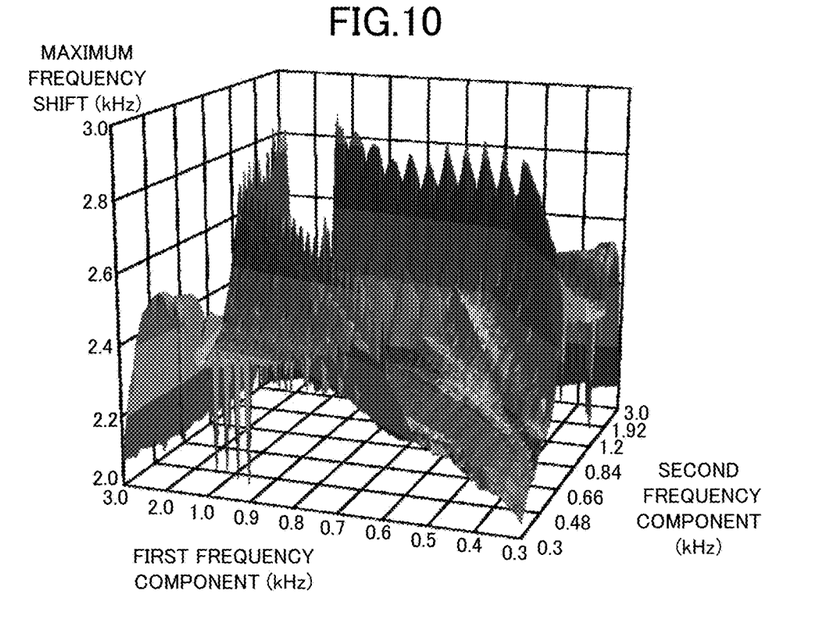
FIG. 10 is a diagram illustrating an example maximum frequency shift in frequency modulation.

FIG. 9 is a diagram illustrating an example maximum frequency shift in frequency modulation by the wireless device according to Embodiment 1. FIG. 9 illustrates the maximum frequency shift in frequency modulation by the modulator 6 of the wireless device 1 when the control target signal contains two frequency components, that is, the first frequency component and the second frequency component. The one axis on the horizontal plane represents the frequency of the first frequency component (unit: kHz), while the other axis represents the frequency of the second frequency component (unit: kHz), and the vertical axis represents the maximum frequency shift (unit: kHz). FIG. 10 is a diagram illustrating an example maximum frequency shift in frequency modulation. FIG. 10 is a diagram illustrating an example maximum frequency shift in frequency modulation when the control target signal contains two frequency components, and the frequency modulation of changing the frequency of carrier wave is performed in accordance with the signal level of the signal to be output by the first suppressor 13 of the wireless device 1. What the horizontal axis and the vertical axis in FIG. 10 represent are similar to those in FIG. 9.

FIGS. 9 and 10 clarify that, by providing the reducer 14 that includes the second limiter circuit 15 and the second suppressor 16, an increase in the maximum frequency shift in frequency modulation can be suppressed regardless of the value of the frequency component contained in the control target signal.

Figure 11:
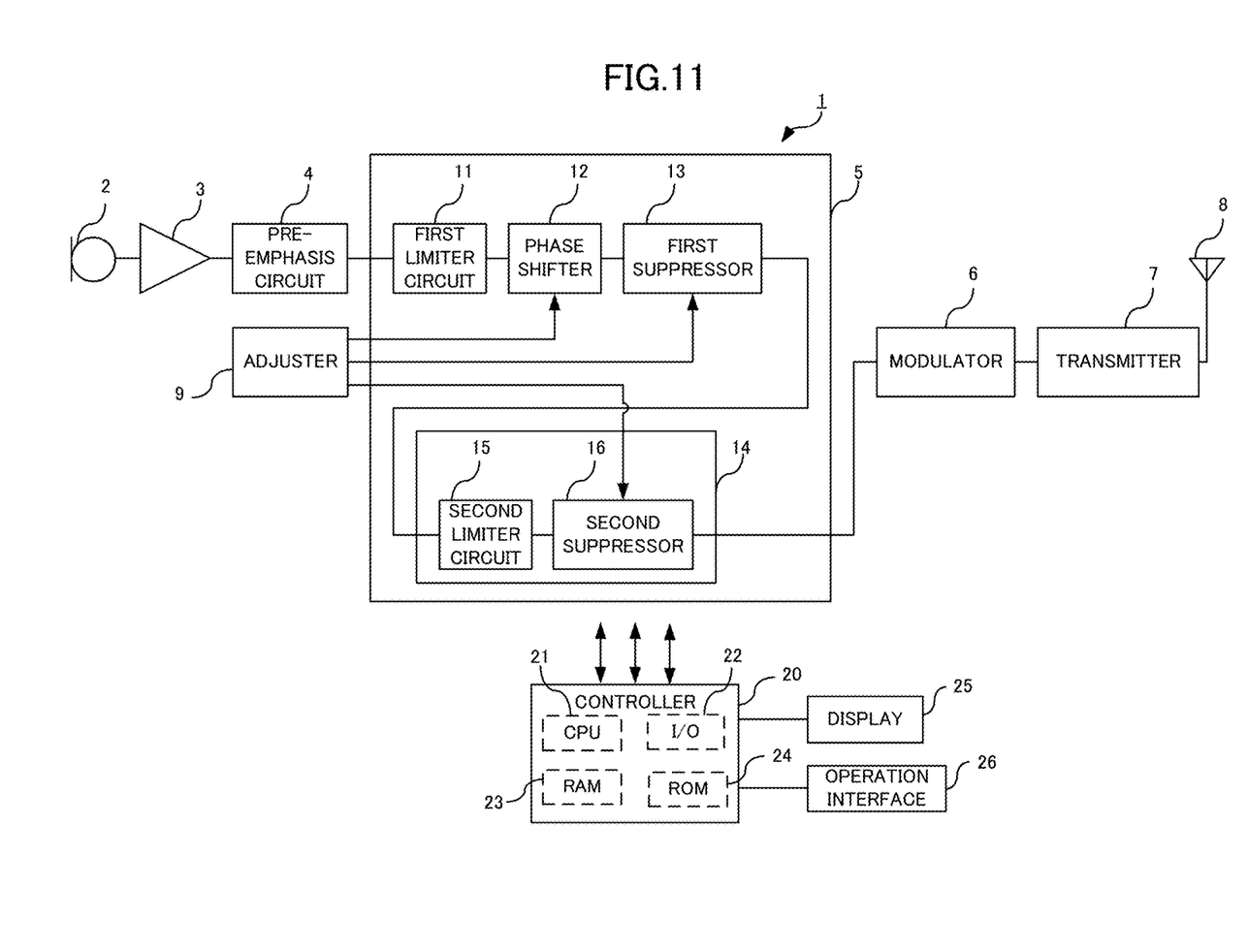
FIG. 11 is a block diagram illustrating another example configuration of the wireless device according to Embodiment 1.

FIG. 11 is a block diagram illustrating another example configuration of the wireless device according to Embodiment 1. The wireless device 1 illustrated in FIG. 11 includes, in addition to the configuration of the wireless device 1 illustrated in FIG. 1, an adjuster 9. The adjuster 9 adjusts at least any one of followings: the first frequency range used by the phase shifter 12 and the phase shift amount; the second threshold used by the first suppressor 13; and the second frequency range used by the reducer 14 in accordance with the occupied bandwidth of the transmission signal. The wireless device 1 includes two operation modes that are a narrow-band mode and a wide-band mode. The occupied bandwidth of the transmission signal in the narrow-band mode is narrower than the occupied bandwidth of the transmission signal in the wide-band mode. For example, based on whether the wireless device 1 is in operation in the narrow-band mode or in the wide-band mode, the adjuster 9 adjusts at least one of followings: the first frequency range that is the target of the phase shift and the phase shift amount in the all-pass filter constituting the phase shifter 12, the cut-off frequency of the splatter filter constituting the first suppressor 13, and the cut-off frequency of the splatter filter constituting the second reducer 16. The adjuster 9 may be built as a function of the controller 20.

As described above, according to the shift control circuit 5 of the wireless device 1 according to Embodiment 1, the reducer 14 suppresses the frequency component within the second frequency range for the control target signal, and thus an increase in the maximum frequency shift in frequency modulation can be suppressed.

Embodiment 2

Figure 12:
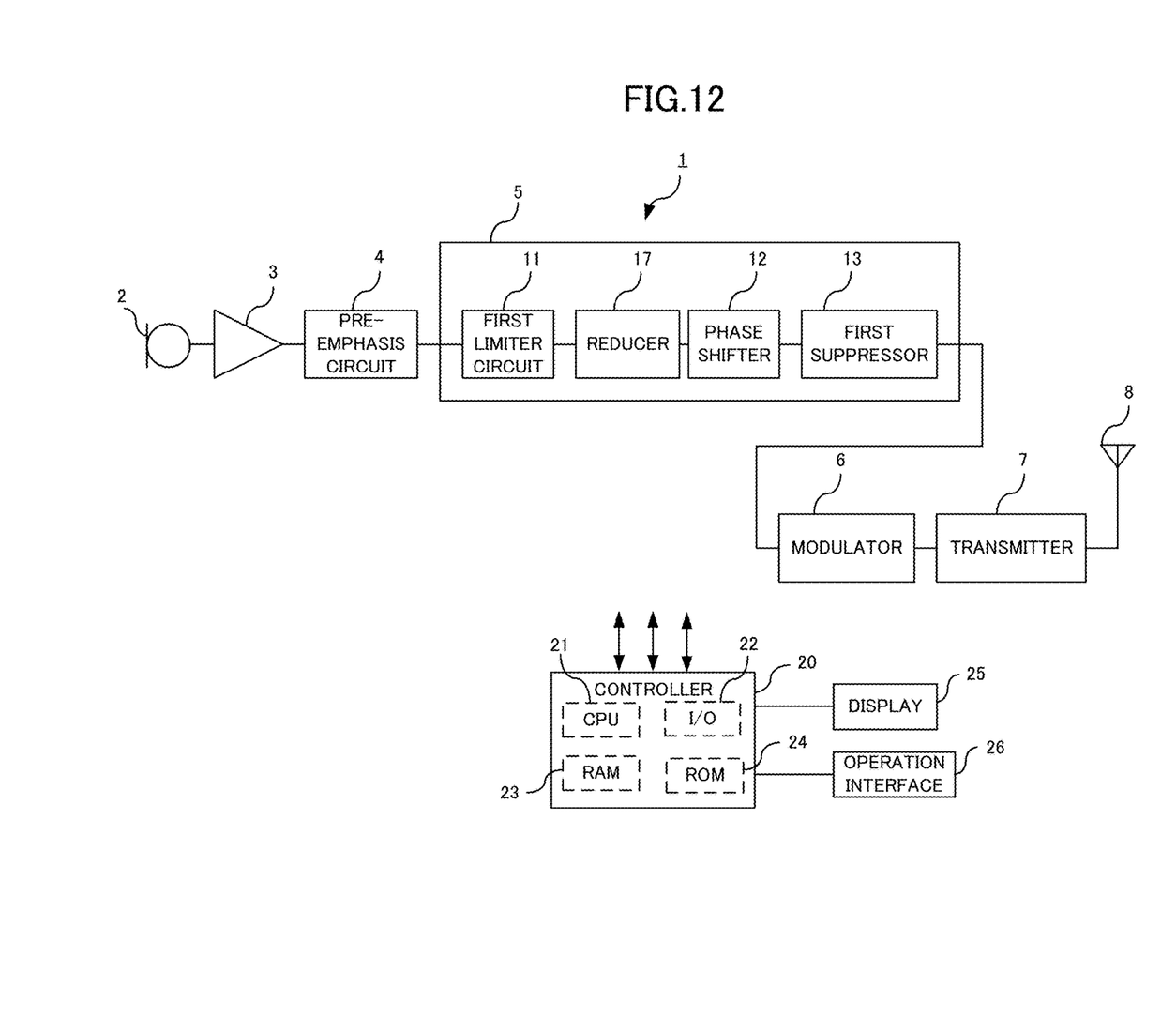
FIG. 12 is a block diagram illustrating an example configuration of a wireless device according to Embodiment 2 of the present disclosure.

FIG. 12 is a block diagram illustrating an example structure of a wireless device according to Embodiment 2 of the present disclosure. The shift control circuit 5 of the wireless device 1 according to Embodiment 2 illustrated in FIG. 12 includes, like Embodiment 1, the first limiter circuit 11, the phase shifter 12, and the first suppressor 13, and further a reducer 17. The reducer 17 suppresses, for the control target signal having the amplitude limited by the first limiter circuit 11, the frequency component within the second frequency range, thereby reducing the wave height value of the information signal. The second frequency range is a frequency range equal to or less than a fifth threshold. That is, the reducer 17 suppresses, for the control target signal having undergone the amplitude limitation by the first limiter circuit 11, the frequency component equal to or less than the fifth threshold. The reducer 17 is a high-pass filter. The high-pass filter attenuates the frequency component equal to or less than the fifth threshold which is the cut-off frequency. The phase shifter 12 performs phase shift on the control target signal having the frequency component that is equal to or less than the fifth threshold and is suppressed by the reducer 17 like Embodiment 1. The first suppressor 13 suppresses, for the control target signal phase-shifted by the phase shifter 12, the frequency component within the first frequency range like Embodiment 1. By suppressing the low frequency component by the reducer 17, an increase in the maximum frequency shift in frequency modulation can be suppressed.

Figure 13:
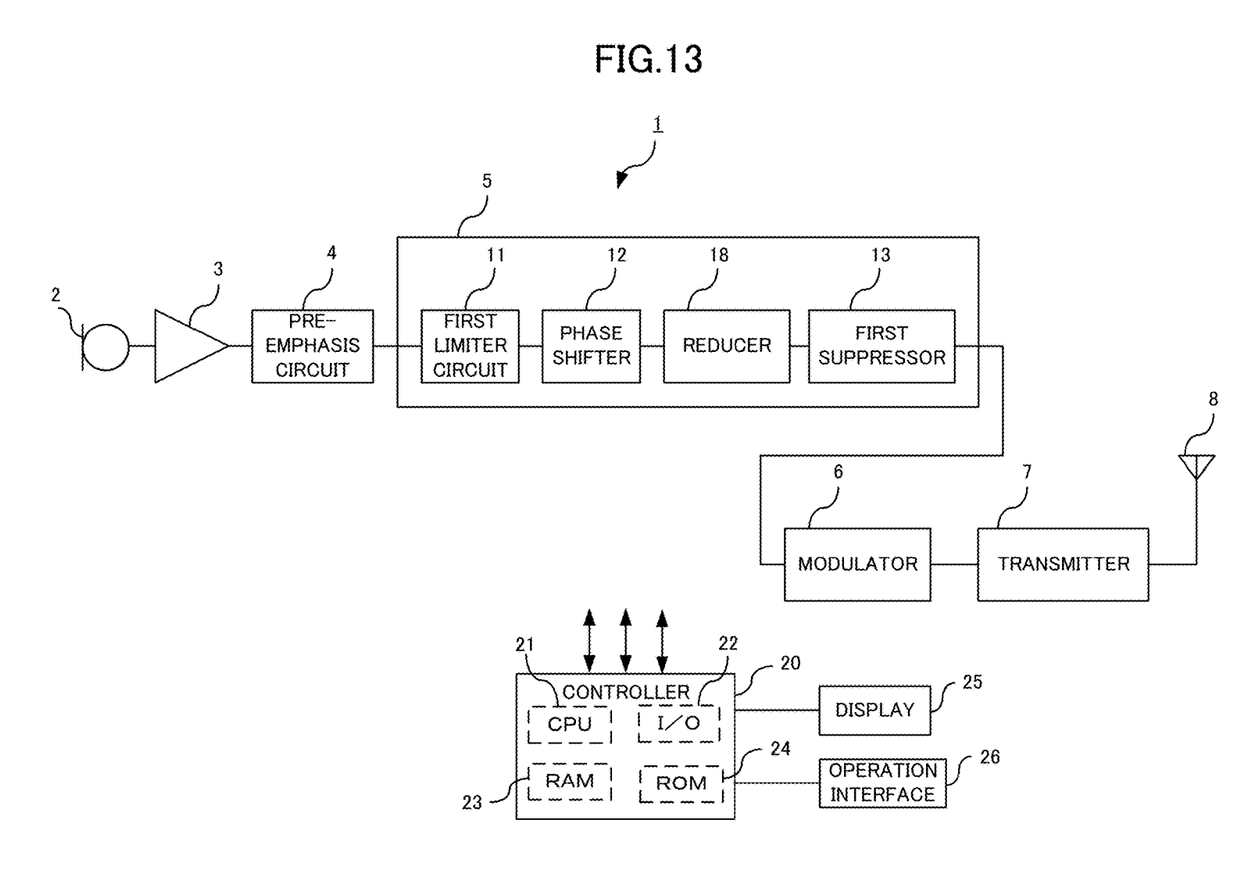
FIG. 13 is a block diagram illustrating another example configuration of the wireless device according to Embodiment 2.

FIG. 13 is a block diagram illustrating another example configuration of the wireless device according to Embodiment 2 of the present disclosure. The shift control circuit 5 of the wireless device 1 according to Embodiment 2 illustrated in FIG. 13 includes, like Embodiment 1, the first limiter circuit 11, the phase shifter 12, and the first suppressor 13, and further a reducer 18 that suppresses, for the control target signal phase-shifted by the phase shifter 12, the frequency component within the second frequency range. The second frequency range is a frequency range equal to or less than a sixth threshold. The reducer 18 suppresses, for the control target signal having undergone the phase shift by the phase shifter 12, the frequency component equal to or less than the sixth threshold. The reducer 18 is a high-pass filter. The high-pass filter attenuates the frequency component equal to or less than the sixth threshold that is the cut-off frequency. The first suppressor 13 suppresses the frequency component within the second frequency range for the control target signal having the frequency component that is equal to or less than the sixth threshold, and is suppressed by the reducer 18. By suppressing the low frequency component by the reducer 18, an increase in the maximum frequency shift in frequency modulation can be suppressed.

Figure 14:
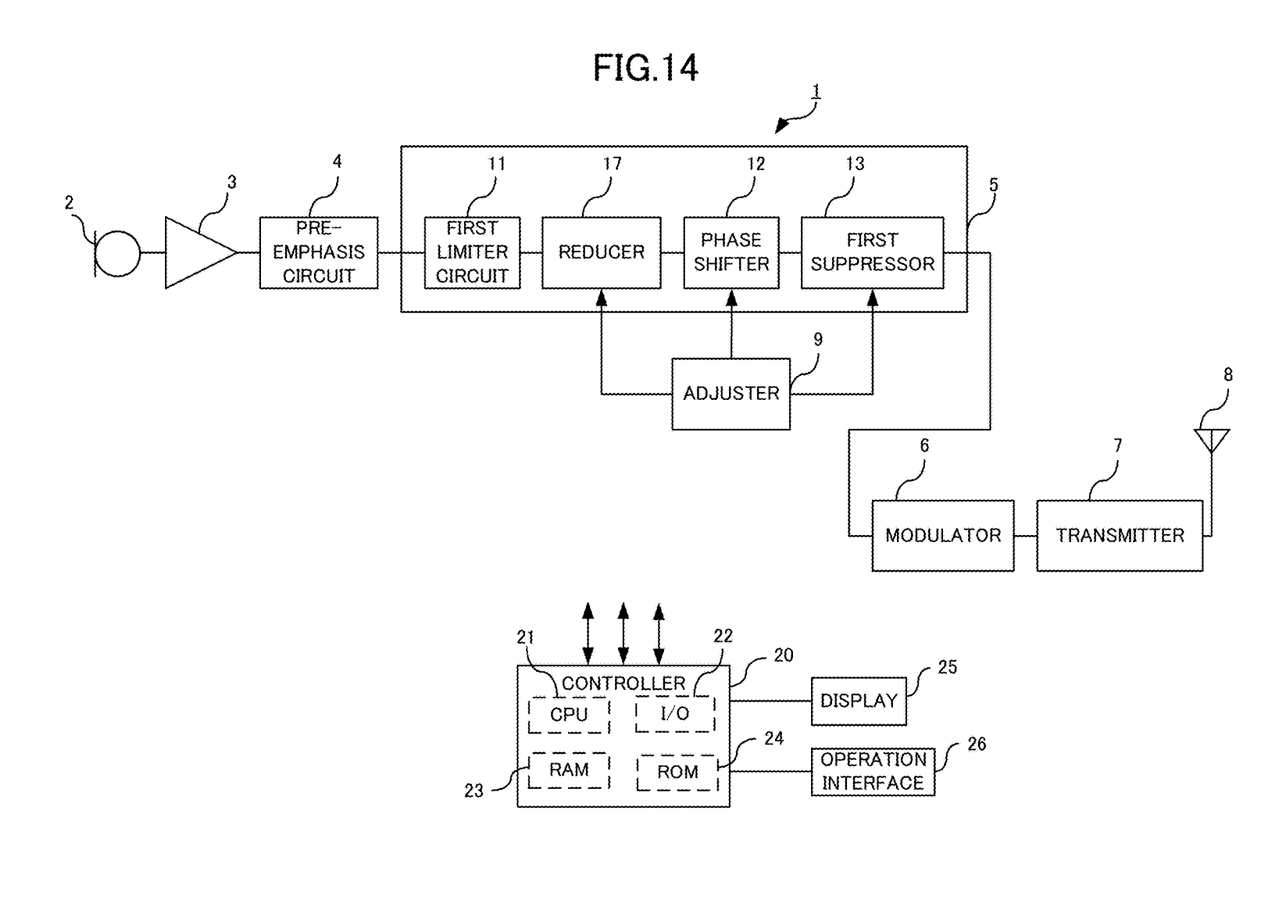
FIG. 14 is a block diagram illustrating another example configuration of the wireless device according to Embodiment 2.

FIG. 14 is a block diagram illustrating another example configuration of the wireless device according to Embodiment 2. The wireless device 1 illustrated in FIG. 14 includes, in addition to the configuration of the wireless device 1 illustrated in FIG. 12, an adjuster 9. The adjuster 9 adjusts at least any one of followings: the first frequency range used by the phase shifter 12 and the phase shift amount; the second threshold used by the first suppressor 13; and the fifth threshold used by the reducer 17 in accordance with the occupied bandwidth of the transmission signal. For example, based on whether the wireless device 1 is in operation in the narrow-band mode or in the wide-band mode, the adjuster 9 adjusts at least one of followings: the first frequency range that is the target of the phase shift in the all-pass filter and the phase shift amount; the second threshold used by the first suppressor 13; and the cut-off frequency of the high-pass filter constituting the reducer 17. The wireless device 1 may include, in addition to the configuration illustrated in FIG. 13, the adjuster 9. The adjuster 9 may be built as a function of the controller 20.

As described above, according to the shift control circuit 5 of the wireless device 1 according to Embodiment 2, since the reducers 17, 18 suppress the frequency component within the second frequency range for the control target signal, an increase in the maximum frequency shift in frequency modulation can be suppressed.

The present disclosure is not limited to the above embodiments. For example, the phase shifter 12, and the first suppressor 13 may be accomplished by a single splatter filter that includes an IIR filter. The configuration in which the phase shifter 12 and the first suppressor 13 are accomplished by the single IIR filter reduces the number of taps for filtration.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

What is claimed is:

1. A shift control circuit provided in a wireless device that performs frequency modulation, and outputting an information signal to be applied to the frequency modulation, the shift control circuit comprising:

a first limiter circuit that limits an amplitude of an input control target signal to be equal to or less than a first threshold;

a phase shifter that shifts, for the control target signal having the amplitude limited by the first limiter circuit to be equal to or less than the first threshold, a phase of a frequency component within a predetermined first frequency range by a predetermined amount;

a first suppressor that suppresses, for the control target signal phase-shifted by the phase shifter, the frequency component equal to or greater than a second threshold; and a reducer that suppresses, for any of (i) the control target signal having the amplitude limited by the first limiter circuit to be equal to or less than the first threshold, (ii) the control target signal phase-shifted by the phase shifter, and (iii) the control target signal having the frequency component equal to or greater than the second threshold and suppressed by the first suppressor, a frequency component within a predetermined second frequency range, and thus reducing a wave height value of the information signal, wherein the shift control circuit outputs the information signal that is the control target signal having the frequency component equal to or greater than the second threshold and suppressed by the first suppressor or the control target signal having the frequency component within the second frequency range and suppressed by the reducer.

2. The shift control circuit according to claim 1, wherein:
the reducer comprises:

a second limiter circuit that limits, for the control target signal having the frequency component equal to or greater than the second threshold and suppressed by the first suppressor, the amplitude to be equal to or less than a third threshold; and a second suppressor that suppresses, for the control target signal having the amplitude limited by the second limiter circuit to be equal to or less than the third threshold, the frequency component equal to or greater than a fourth threshold, and the shift control circuit outputs the information signal that is the control target signal having the frequency component equal to or greater than the fourth threshold and suppressed by the second suppressor.

3. The shift control circuit according to claim 2, wherein the third threshold is greater than the first threshold.

4. The shift control circuit according to claim 2, wherein the fourth threshold is regarded as being consistent with the second threshold.

5. The shift control circuit according to claim 3, wherein the fourth threshold is regarded as being consistent with the second threshold.

6. The shift control circuit according to claim 1, wherein:
the second frequency range is a frequency range equal to or less than a fifth threshold;
the reducer suppresses, for the control target signal having the amplitude limited by the first limiter circuit to be equal to or less than the first threshold, a frequency component equal to or less than the fifth threshold;
the phase shifter performs phase shift on the control target signal having the amplitude limited by the first limiter circuit to be equal to or less than the first threshold, and having the frequency component equal to or less than the fifth threshold and suppressed by the reducer; and
the shift control circuit outputs the information signal that is the control target signal having the frequency component equal to or greater than the second threshold and suppressed by the first suppressor.

7. The shift control circuit according to claim 1, wherein:
the second frequency range is a frequency range equal to or less than a sixth threshold;
the reducer suppresses, for the control target signal phase-shifted by the phase shifter, the frequency component equal to or less than the sixth threshold;
the first suppressor suppresses, for the control target signal phase-shifted by the phase shifter and having the frequency component equal to Of less than the sixth threshold and suppressed by the reducer, the frequency component equal to or greater than the second threshold; and
the shift control circuit outputs the information signal that is the control target signal having the frequency component equal to or greater than the second threshold and suppressed by the first suppressor.

8. A wireless device comprising:
a shift control circuit that outputs an information signal to be applied to frequency modulation;
a modulator that performs frequency modulation of changing a frequency of a carrier wave in accordance with a signal level of the information signal; and
a transmitter that produces a transmission signal from the carrier wave frequency-modulated by the modulator, and transmits the produced signal via an antenna,
wherein:
the shift control circuit comprises:
a first limiter circuit that limits an amplitude of an input control target signal to be equal to or less than a first threshold;
a phase shifter that shifts, for the control target signal having the amplitude limited by the first limiter circuit to be equal to or less than the first threshold, a phase of a frequency component within a predetermined first frequency range by a predetermined amount;
a first suppressor that suppresses, for the control target signal phase-shifted by the phase shifter, the frequency component equal to or greater than a second threshold; and
a reducer that suppresses, for any of (i) the control target signal having the amplitude limited by the first limiter circuit to be equal to or less than the first threshold, (ii) the control target signal phase-shifted by the phase shifter, and (iii) the control target signal having the frequency component equal to or greater than the second threshold and suppressed by the first suppressor, a frequency component within a predetermined second frequency range, and thus reducing a wave height value of the information signal, and
the shift control circuit outputs the information signal that is the control target signal having the frequency component equal to or greater than the second threshold and suppressed by the first suppressor or the control target signal having the frequency component within the second frequency range and suppressed by the reducer.

9. The wireless device according to claim 8, wherein:
the reducer comprises:
a second limiter circuit that limits, for the control target signal having the frequency component equal to or greater than the second threshold and suppressed by the first suppressor, the amplitude to be equal to or less than a third threshold; and
a second suppressor that suppresses, for the control target signal having the amplitude limited to be equal to or less than the third threshold by the second limiter circuit, the frequency component equal to or greater than a fourth threshold, and
the shift control circuit outputs the information signal that is the control target signal having the frequency component equal to or greater than the fourth threshold and suppressed by the second suppressor.

10. The wireless device according to claim 9, wherein the third threshold is greater than the first threshold.

11. The wireless device according to claim 9, wherein the fourth threshold is regarded as being consistent with the second threshold.

12. The wireless device according to claim 10, wherein the fourth threshold is regarded as being consistent with the second threshold.

13. The wireless device according to claim 8, wherein:
the second frequency range is a frequency range equal to or less than a fifth threshold;
the reducer suppresses, for the control target signal having the amplitude limited by the first limiter circuit to be equal to or less than the first threshold, a frequency component equal to or less than the fifth threshold;
the phase shifter performs phase shift on the control target signal having the amplitude limited by the first limiter circuit to be equal to or less than the first threshold, and having the frequency component equal to or less than the fifth threshold and suppressed by the reducer; and
the shift control circuit outputs the information signal that is the control target signal having the frequency component equal to or greater than the second threshold and suppressed by the first suppressor.

14. The wireless device according to claim 8, wherein:
the second frequency range is a frequency range equal to or less than a sixth threshold;
the reducer suppresses, for the control target signal phase-shifted by the phase shifter, the frequency component equal to or less than the sixth threshold;
the first suppressor suppresses, for the control target signal phase-shifted by the phase shifter and having the frequency component equal to or less than the sixth threshold and suppressed by the reducer, the frequency component equal to or greater than the second threshold; and
the shift control circuit outputs the information signal that is the control target signal having the frequency component equal to or greater than the second threshold and suppressed by the first suppressor.

15. The wireless device according to claim 8, further comprising an adjuster that adjusts, in accordance with an occupied bandwidth of the transmission signal, at least one of followings: the first frequency range that is a target for the phase shift by the phase shifter and the predetermined amount of the phase shift; the second threshold used by the first suppressor; and the second frequency range used by the reducer.

16. The wireless device according to claim 9, further comprising an adjuster that adjusts, in accordance with an occupied bandwidth of the transmission signal, at least one of followings: the first frequency range that is a target for the phase shift by the phase shifter and the predetermined amount of the phase shift; the second threshold used by the first suppressor; and the second frequency range used by the reducer.

17. The wireless device according to claim 10, further comprising an adjuster that adjusts, in accordance with an occupied bandwidth of the transmission signal, at least one of followings: the first frequency range that is a target for the phase shift by the phase shifter and the predetermined amount of the phase shift; the second threshold used by the first suppressor; and the second frequency range used by the reducer.

18. The wireless device according to claim 11, further comprising an adjuster that adjusts, in accordance with an occupied bandwidth of the transmission signal, at least one of followings: the first frequency range that is a target for the phase shift by the phase shifter and the predetermined amount of the phase shift; the second threshold used by the first suppressor; and the second frequency range used by the reducer.

19. The wireless device according to claim 13, further comprising an adjuster that adjusts, in accordance with an occupied bandwidth of the transmission signal, at least one of followings: the first frequency range that is a target for the phase shift by the phase shifter and the predetermined amount of the phase shift; the second threshold used by the first suppressor; and the second frequency range used by the reducer.

20. The wireless device according to claim 14, further comprising an adjuster that adjusts, in accordance with an occupied bandwidth of the transmission signal, at least one of followings: the first frequency range that is a target for the phase shift by the phase shifter and the predetermined amount of the phase shift; the second threshold used by the first suppressor; and the second frequency range used by the reducer.

* * * * *